(12) United States Patent
Koo et al.

(10) Patent No.: US 7,994,555 B2
(45) Date of Patent: Aug. 9, 2011

(54) SPIN TRANSISTOR USING PERPENDICULAR MAGNETIZATION

(75) Inventors: Hyun-Cheol Koo, Seoul (KR); Suk-Hee Han, Seoul (KR); Joon-Yeon Chang, Seoul (KR); Hyung-Jun Kim, Seoul (KR); Jin-Seock Ma, Seoul (KR)

(73) Assignee: Korea Institute of Science and Technology (KR)

( * ) Notice: Subject to any disclaimer, the term of this patent is extended or adjusted under 35 U.S.C. 154(b) by 239 days.

(21) Appl. No.: 11/949,659

(22) Filed: Dec. 3, 2007

(65) Prior Publication Data

US 2008/0308844 A1    Dec. 18, 2008

(30) Foreign Application Priority Data

Jun. 14, 2007    (KR) .................. 10-2007-0058532

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .............................. 257/295; 257/E29.167

(58) Field of Classification Search .............. 257/295
See application file for complete search history.

(56) References Cited

U.S. PATENT DOCUMENTS

| | | | |
|---|---|---|---|
| 5,654,566 A | 8/1997 | Johnson | |
| 6,355,953 B1 * | 3/2002 | Kirczenow | 257/295 |
| 6,480,412 B1 * | 11/2002 | Bessho et al. | 365/173 |
| 6,482,729 B2 * | 11/2002 | Ohno et al. | 438/602 |
| 7,084,468 B2 * | 8/2006 | Lee et al. | 257/421 |
| 7,307,299 B2 * | 12/2007 | Koo et al. | 257/288 |
| 7,397,071 B2 * | 7/2008 | Sugahara et al. | 257/213 |
| 2005/0282379 A1 | 12/2005 | Saito et al. | |

FOREIGN PATENT DOCUMENTS

| | | | | |
|---|---|---|---|---|
| JP | 200392412 A | | 3/2003 | |
| KR | 200648384 A | | 5/2006 | |
| KR | 10-2005-0085717 B1 * | | 6/2006 | 257/295 |

OTHER PUBLICATIONS

Datta et al., "Electronic analog of the electro-optic modulator", Appl. Phys. Lett 56(7), Feb. 12, 1990, pp. 665-667.

* cited by examiner

*Primary Examiner* — Howard Weiss
(74) *Attorney, Agent, or Firm* — Wells St. John P.S.

(57) ABSTRACT

A spin transistor useful for device miniaturization and high-density integration is provided. The spin transistor includes: a semiconductor substrate including a channel layer; ferromagnetic source and drain disposed on the semiconductor substrate to be separated from each other and to be magnetized in a direction perpendicular to a surface of the channel layer; a gate formed on the semiconductor substrate between the source and the drain to adjust spins of electrons passing through the channel layer, wherein spin-polarized electrons are injected from the source to the channel layer, and the electrons injected into the channel layer pass though the channel layer and are injected into the drain, and wherein the spins of the electrons passing through the channel layer undergo precession due to a spin-orbit coupling induced magnetic field according to a voltage of the gate.

13 Claims, 5 Drawing Sheets

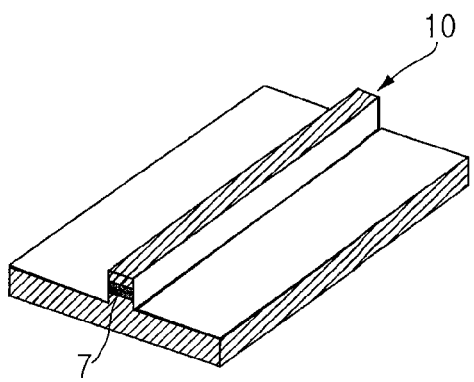
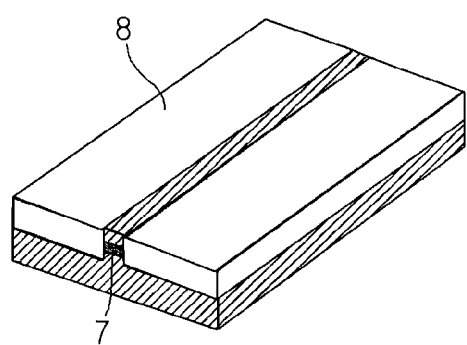
FIG. 4A   FIG. 4B
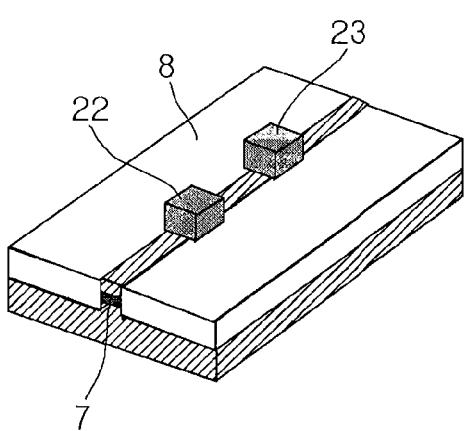
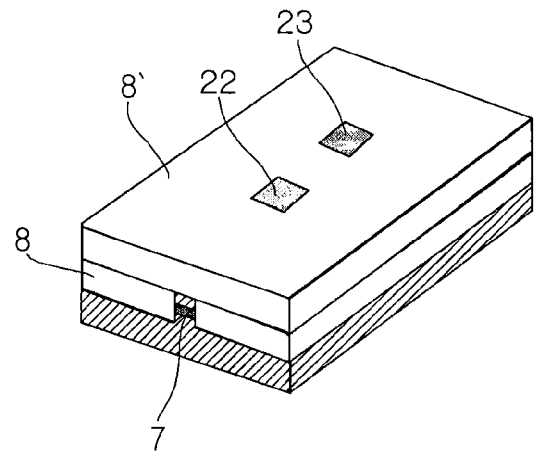
FIG. 4C   FIG. 4D
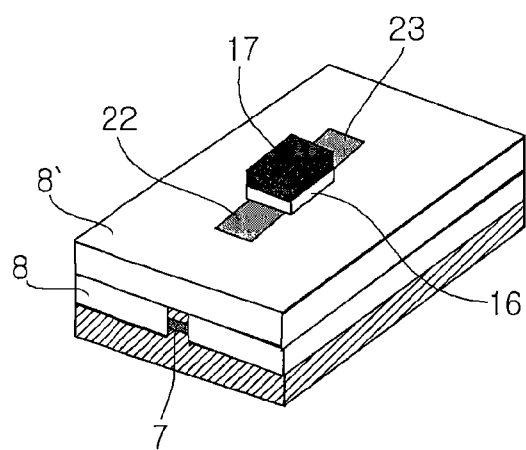
FIG. 4E

SPIN TRANSISTOR USING PERPENDICULAR MAGNETIZATION

CROSS-REFERENCE TO RELATED APPLICATIONS

This application claims the priority of Korean Patent Application No. 2007-58532 filed on Jun. 14, 2007, in the Korean Intellectual Property Office, the disclosure of which is incorporated herein by reference.

BACKGROUND OF THE INVENTION

1. Field of the Invention

The present invention relate to a spin transistor, and more particularly, to a spin transistor useful for device miniaturization and high-density integration.

2. Description of the Related Art

In an integrated circuit (IC) technology, a metal oxide semiconductor field effect Transistor (MOSFET) has been widely used as a basic component for various electronic devices. For example, a memory device such as a dynamic random access memory (DRAM) and a flash memory, an application specific integrated circuit (ASIC) device, a microprocessor, a logic circuit, and the like have been operated by on/off operations of the MOSFET. Recently, as a substitute for the MOSFET, a spin transistor has been actively researched. In a conventional FET device based on a semiconductor, charges in the semiconductor are controlled by using an electric field. In the spin transistor, spins as well as charges are controlled. Namely, a switching device or a logic device is implemented by controlling spin-polarized charges.

In the MOSFET used as a basic component in the current semiconductor devices, a voltage of the MOSFET is written and read by charging and discharging of charges, so that power consumption and area are difficult to reduce. In addition, there is a physical limitation to a gate oxide layer. As one of next-generation devices for solving the problems of the MOSFET, transistors of controlling a voltage thereof by using precession of electron spins have been proposed. Among such transistors using electron spins, a spin transistor includes ferromagnetic source and drain, and a semiconductor channel interposed between the source and drain.

In a Datta-Das type spin transistor (published in Applied physics letter, vol 56, 665, 1990) and a similar spin transistor (disclosed in U.S. Pat. No. 5,654,566, titled, "Magnetic Spin Injected Field Effect Transistor and Method of Operation"), spin injection from a ferromagnetic source to a semiconductor channel or from the semiconductor channel to a ferromagnetic drain needs to be performed. Due to the spin injection, the ferromagnetic source and drain having shape anisotropy are magnetized in a channel direction so that an electron spin direction is defined. Therefore, the ferromagnetic source and drain are designed to be elongated in the channel direction. As a result, a size of the spin transistor is also increased in the channel direction.

SUMMARY OF THE INVENTION

An aspect of the present invention provides a spin transistor useful for device miniaturization and high-density integration and capable of controlling resistance by using a gate.

According to an aspect of the present invention, there is provided a spin transistor comprising: a semiconductor substrate including a channel layer; ferromagnetic source and drain disposed on the semiconductor substrate to be separated from each other and to be magnetized in a direction perpendicular to a surface of the channel layer; a gate formed on the semiconductor substrate between the source and the drain to adjust spins of electrons passing through the channel layer, wherein spin-polarized electrons are injected from the source to the channel layer, and the electrons injected into the channel layer pass though the channel layer and are injected into the drain, and wherein the spins of the electrons passing through the channel layer undergo precession due to a spin-orbit coupling induced magnetic field according to a voltage of the gate. In the above aspect, the ferromagnetic source and drain may be magnetized in the same direction.

In addition, the source and the drain may have a structure obtained by alternately laminating ferromagnetic films and non-magnetic films in a direction perpendicular to the surface of the channel layer. In addition, the ferromagnetic film may be made of one selected from a group consisting of CoFe, Co, Ni, NiFe, and a combination thereof. In addition, the non-magnetic film may be made of one selected from a group consisting of Pd, Au, Pt, and a combination thereof.

In addition, the source and the drain may have magnetocrystalline anisotropy where an easy-crystallization axis is perpendicular to the surface of the channel layer. In addition, a height of each of the source and the drain may be larger than a width and a length thereof to form shape anisotropy, so that magnetization direction thereof is perpendicular to the surface of the channel layer.

In addition, at least one of the source and the drain may be made of a magnetic metal selected from a group consisting of Fe, Co, Ni, CoFe, NiFe, and a combination thereof. In addition, at least one of the source and the drain may be made of a magnetic semiconductor selected from a group consisting of (Ga, Mn)As, (In,Mn)As, and a combination thereof.

In addition, the channel layer may constitute a two-dimensional electron gas layer. In addition, the two-dimensional electron gas layer may be formed with a material selected from a group consisting of GaAs, InAs, InGaAs, InSb, and a combination thereof. In addition, the semiconductor substrate may include a lower cladding layer and a upper cladding layer interposing the channel layer constituting the two-dimensional electron gas layer, wherein the lower cladding layer includes a first lower cladding layer and a second lower cladding layer formed under the first lower cladding layer and having a band gap larger than that of the first lower cladding layer, and wherein the upper cladding layer includes a first upper cladding layer and a second upper cladding layer formed on the first upper cladding layer and having a band gap larger than that of the first upper cladding layer.

In addition, the source and the drain may be buried under the upper surface of the semiconductor substrate to extend down to the first upper cladding layer or a portion below the first upper cladding layer. In addition, lower surfaces of the source and the drain may be formed to extend down to the channel layer. In addition, lower surfaces of the source and the drain may be formed to extend down to the lower cladding layer.

In addition, the channel layer may be made of InAs, wherein the first lower cladding layer and the first upper cladding layer are made of undoped InGaAs, and wherein the second lower cladding layer and the second upper cladding layer are made of undoped InAlAs.

In addition, the semiconductor substrate may have a ridge structure where two side portions of the semiconductor substrate are removed in the length direction of the channel layer, wherein a width of the channel layer is defined by the ridge structure, and wherein an insulating layer for planarization is formed on the two sides of the ridge structure.

BRIEF DESCRIPTION OF THE DRAWINGS

The above and other aspects, features and other advantages of the present invention will be more clearly understood from the following detailed description taken in conjunction with the accompanying drawings, in which:

FIGS. 4A to 4E are views for explaining a method of manufacturing the spin transistor according to the embodiment of the present invention;

DETAILED DESCRIPTION OF THE PREFERRED EMBODIMENT

Hereinafter, exemplary embodiments of the present invention will now be described in detail with reference to the accompanying drawings. The embodiments of the present invention may be modified in various forms, and the scope of the present invention is not limited to the embodiments. The embodiments of the present invention are provided in order that the ordinarily skilled in the art can have the better understanding of the present invention.

Figure 1:
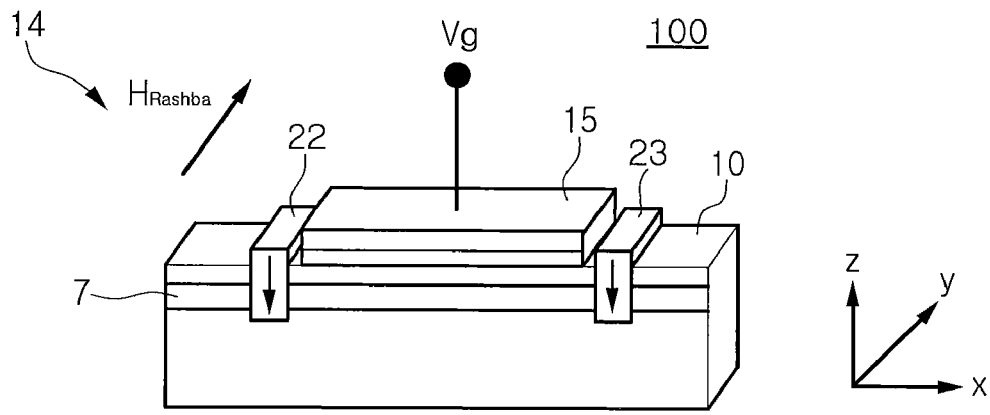
FIG. 1 is a perspective view illustrating a spin transistor according to an embodiment of the present invention.

FIG. 1 is a perspective view illustrating a spin transistor according to an embodiment of the present invention. Referring to FIG. 1, the spin transistor 100 includes a semiconductor substrate 10 having a channel layer 7 and a ferromagnetic source 22 and a ferromagnetic drain 23 which are disposed on the semiconductor substrate 10 to be separated from each other. A gate 15 is disposed on the semiconductor substrate 10 between the source 22 and the drain 23. The gate 15 is insulated from the source 22, the drain 23, and the semiconductor substrate 10 by a gate insulating layer 16.

At the time of operating the spin transistor 100, spin-polarized electrons are injected from the source 22 to the channel layer 7. While the electrons injected to the channel layer 7 pass through the channel layer 7, spins of the electrons are controlled by a voltage (gate voltage) applied from the gate 15. The spin-polarized electrons that pass through the channel layer 7 are injected to the ferromagnetic drain 23. When the electron having a wave vector k passing through the channel layer 7 is under an electric field E perpendicular to the wave vector k, spin-orbit coupling occurs in the electron, so that an spin-orbit coupling magnetic field 14 expressed $H_{Rashba} \Box k \times E$ is generated on the electron in the channel layer 7. The generation of the magnetic field 14 is called Rashba field. In FIG. 1, assuming that the current of the spin-polarized electrons flows in the x direction and the electric field generated by the gate voltage is in the z direction, spin-orbit coupling magnetic field 14 is generated (or induced) in the y direction.

The electron spin passing through the channel layer 7 undergoes precession about an axis parallel to the direction of the induced spin-orbit coupling induced magnetic field 14. The resistance of the spin transistor 100 can be adjusted by controlling a precession angle of the electron spin by using the gate voltage. If the spin direction of the electron reaching the drain 23 is identical to the magnetization direction of the drain 23 (in a parallel state), the spin transistor 100 has a low resistance, so that the spin transistor 100 is in ON-state. If the spin direction of the electron reaching the drain 23 is opposite to the magnetization direction of the drain 23 (in an anti-parallel state), the spin transistor 100 has a high resistance, so that the spin transistor 100 is in OFF-state.

According to the embodiment, as shown in FIG. 1, the ferromagnetic source and drain 22 and 23 are magnetized in a direction perpendicular to the surface of the channel layer 7, and the magnetization directions of the ferromagnetic source and drain 22 and 23 are equal to each other. Since the magnetization directions of the source and drain 22 and 23 are the direction (z direction) perpendicular to the surface of channel layer 7 and the direction of the spin-orbit coupling induced magnetic field 14 is parallel to the y axis, the electron spin passing through the channel layer 7 undergoes the precession on the x-y plane. A degree of precession of the electron spin passing through the channel layer 7 is adjusted by using the gate voltage applied from the gate 15, and the polarization direction of the electron spin approaching the drain 23 is in the +z or −z direction, so that the on and off states of the spin transistor 100 can be controlled.

According to the embodiment, as shown in FIG. 1, since the ferromagnetic source and drain 22 and 23 are magnetized in the direction (indicated by arrow in the figure) perpendicular to the surface of the channel layer 7, the spin transistor 100 need not use the shape anisotropy of the ferromagnetic pattern elongated in the channel direction, which is required in the conventional spin transistor proposed by Datta and Das (see Applied Physics Letters, 56, 665 (1990)). Therefore, the lengths of the source and drain 22 and 23 in the channel direction can be greatly reduced. Accordingly, it is possible to easily implement a small-sized spin transistor device and a highly-integrated electronic device using the spin transistor.

In addition, as described later, the perpendicularly-magnetized ferromagnetic source and drain 22 and 23 are buried under an upper surface of the semiconductor substrate 10, so that lower surfaces of the ferromagnetic source and drain 22 and 23 buried in the semiconductor substrate 10 can be extended under the upper surface of the semiconductor substrate 10. Therefore, an energy barrier for spin injection (that is, an energy barrier between the channel layer 7 and the ferromagnetic source and drain 22 and 23) can be reduced. Due to the reduction of the energy barrier of spin injection, an strength of spin injection from the ferromagnetic source 23 to the channel layer 7 can be improved, and a sensitivity for spin signal can be improved.

Figure 2:
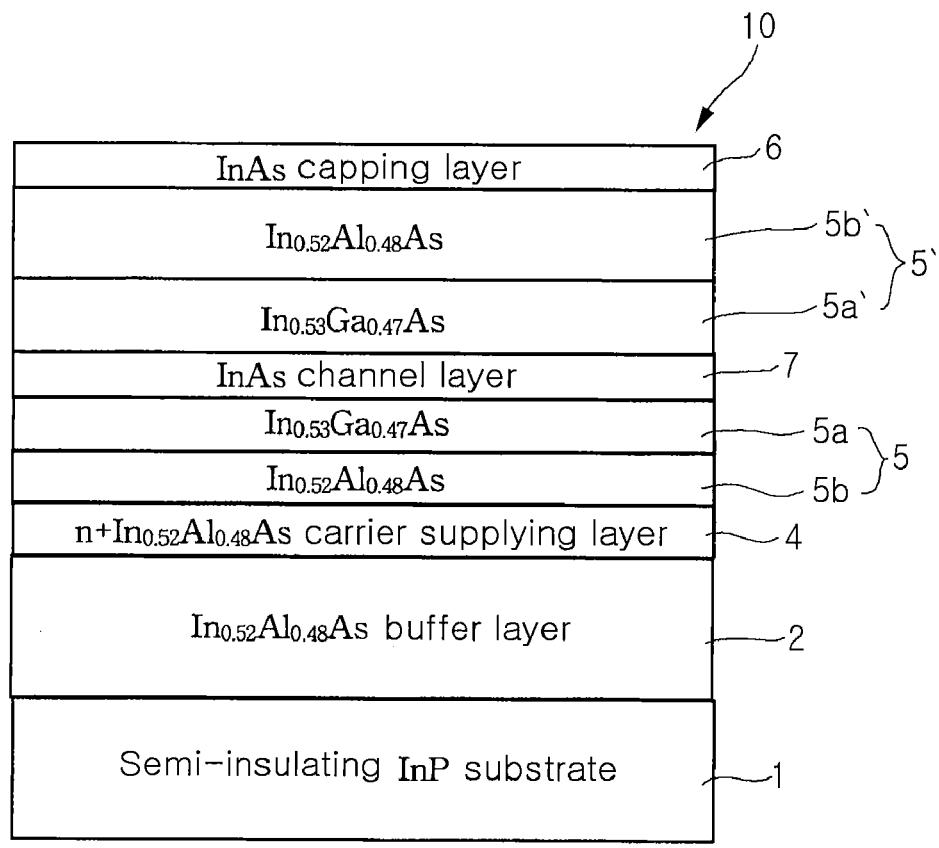
FIG. 2 is a cross-sectional view illustrating a substrate for the spin transistor according to the embodiment of the present invention.

FIG. 2 is a cross-sectional view illustrating the semiconductor substrate 10 of the spin transistor 100 according to the embodiment of the present invention. Referring to FIG. 2, the semiconductor substrate 10 includes an semi-insulating InP substrate 1, an InAlAs buffer layer 2, an n-doped InAlAs carrier supplying layer 4, an undoped InGaAs/InAlAs lower cladding layer 5, an InAs channel layer 7, an undoped InAlAs/InGaAs upper cladding layer 5', and an InAs capping layer 6, which are sequentially laminated in this order.

Each of the lower and upper cladding layers 5 and 5' has a double cladding structure constructed with an undoped InGaAs layer and an undoped InAlAs layer. More specifically, the lower cladding layer 5 includes a first lower cladding layer 5a made of InGaAs and an second lower cladding layer 5b made of InAlAs which underlies the first lower cladding layer 5a. The upper cladding layer 5' includes a first upper cladding layer 5a' made of InGaAs and a second upper cladding layer 5b' made of InAlAs which is disposed on the first upper cladding layer 5a'. The second lower cladding layer 5b has a larger energy band gap than the first lower cladding layer 5a, and the second upper cladding layer 5b' also has a larger energy band gap than the first upper cladding layer 5a'.

The channel layer 7 constitutes a quantum well due to the energy barriers of the upper and lower cladding layers 5 and 5'. Particularly, since each of the upper and lower cladding layers 5 and 5' has the double cladding structure, electrons are confined in the channel layer 7. As a result, a two-dimensional electron gas (2-DEG) layer is formed in the channel layer 7. In the two-dimensional electron gas layer, electron mobility is very high, and the spin-orbit coupling efficiency is also very high. In the embodiment, the channel layer 7 is made of InAs, but the present invention is not limited thereto. For example, the channel layer having the two-dimensional electron gas layer may be implemented by using GaAs, InGaAs, or InSb.

The n-doped InAlAs carrier supplying layer 4 is formed under the channel layer 7 so as to supply charges to the channel layer 7. The InAlAs buffer layer 2 releases lattice mismatch between the InP substrate 1 and the lower cladding layer 5. The InAs capping layer 6 formed as the uppermost layer of the semiconductor substrate 10 has a function of preventing oxidation and degeneration of the semiconductor substrate 10 during production processes thereof.

The source 23 and the drain 24 may be made of a magnetized ferromagnetic material, for example, a magnetic metal selected from a group consisting of Fe, Co, Ni, CoFe, NiFe, and a combination thereof. Alternatively, at least one of the source 23 and the drain 24 may be made of a magnetic semiconductor material selected from a group consisting of (Ga, Mn)As, (In, Mn)As, and a combination thereof. As shown in FIG. 1, in order to obtain the perpendicular magnetization of the ferromagnetic source and drain 22 and 23 which is perpendicular to the surface of the channel layer 7, various magnetization methods can be used. For example, the perpendicular magnetization of the ferromagnetic source and drain 22 and 23 which is parallel to the z axis can be obtained by alternately laminating thin ferromagnetic films and non-magnetic films (see FIG. 5). Alternatively, the perpendicular magnetization of the ferromagnetic source and drain 22 and 23 which is parallel to the z axis can be obtained by using magnetocrystalline anisotropy or a shape anisotropy.

Figure 3A:
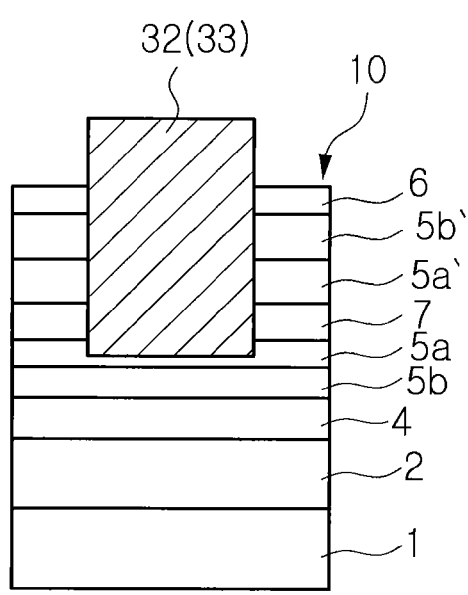
FIGS. 3A to 3C are cross-sectional views illustrating cross-sectional structures of spin transistors according to various embodiments of the present invention.
Figure 3B:
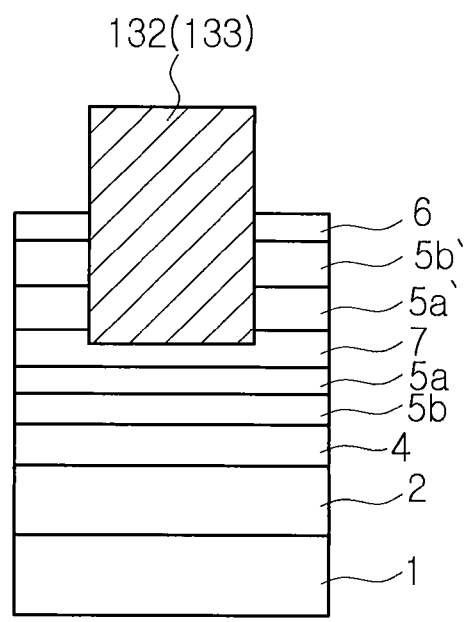
Figure 3C:
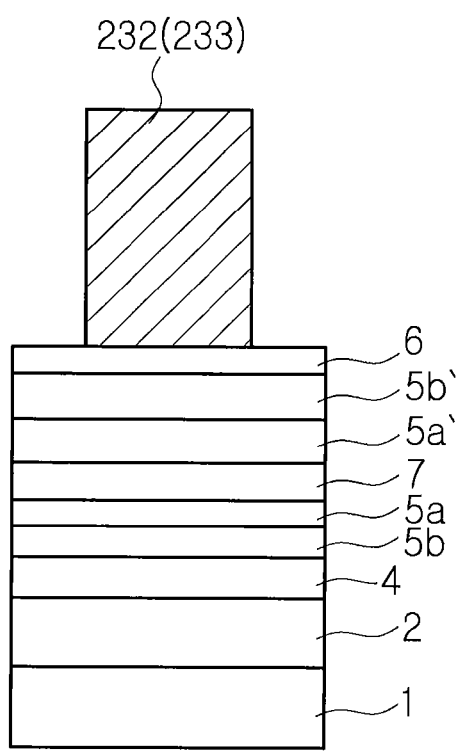

FIGS. 3A to 3C are cross-sectional views illustrating cross-sectional structures of spin transistors according to various embodiments of the present invention.

In the embodiment shown in FIG. 3A, the perpendicular magnetized ferromagnetic source and drain 22 and 23 are buried under the upper surface of the semiconductor substrate 10 to extend through the channel layer 7 down to the first lower cladding layer 5a. Therefore, the lower surfaces of the source and drain 22 and 23 are in contact with the first lower cladding layer 5a. As described later, portions of the semiconductor substrate 10 where the ferromagnetic source and drain 22 and 23 are to be buried may be removed by using an ion-milling process or a drying etching process.

Since the ferromagnetic source 22 is formed to extend down to the lower cladding layer 5, the electron injected from the source 22 need not cross over a high energy barrier of the lower cladding layer. Therefore, a total energy barrier to the electron injected from the ferromagnetic source 22 to channel layer 7 can be greatly reduced, and the efficiency of spin electron injection can be improved without large noise. In addition, a sensitivity for spin signal can be improved.

In the embodiment shown in FIG. 3B, the perpendicular magnetized ferromagnetic source and drain 22 and 23 are buried under the upper surface of the semiconductor substrate 10 to extend down to the channel layer 7. Therefore, the lower surfaces of the source and drain 22 and 23 are in direct contact with the channel layer 7.

Since the ferromagnetic source 22 is formed to be in direct contact to the channel layer 7, the electron injected from the source 22 need not cross over a high energy barrier of the upper cladding layer, although a contact resistance exists. Therefore, a total energy barrier to the electron injected from the ferromagnetic source 22 to channel layer 7 can be greatly reduced, and the efficiency of spin electron injection can be improved without large noise. In addition, a sensitivity for spin signal can be improved.

According to the embodiments shown in FIGS. 3A and 3B, the ferromagnetic source and drain 22 and 23 are magnetized in the direction perpendicular to the surface of the channel layer 7. Therefore, the ferromagnetic source and drain 22 and 23 need not have shape isotropy in the channel direction and to be elongated in the channel direction. Accordingly, it is possible to easily implement a small-sized spin transistor and a highly-integrated semiconductor IC device using the spin transistor.

In the embodiment shown in FIG. 3C, the perpendicular magnetized ferromagnetic source and drain 22 and 23 are not buried under the upper surface of the semiconductor substrate 10 but disposed on the semiconductor substrate 10. In comparison to the embodiments shown in FIGS. 3A and 3B, the spin barrier in the embodiment shown in FIG. 3C is high. However, the ferromagnetic source and drain 22 and 23 do not have the shape anisotropy in the channel direction. Similarly to the aforementioned embodiments, since the source and drain 22 and 23 are magnetized in the direction perpendicular to the surface of the channel layer 7, it is possible to easily implement a small-sized spin transistor and a highly-integrated semiconductor IC device using the spin transistor.

In addition to the aforementioned embodiments, various embodiments are available. For example, the ferromagnetic source and drain 22 and 23 may be formed to extend down to the second lower cladding layer 5b under the semiconductor substrate 10 so that the lower surface of the source and drain 22 and 23 are in contact with the second lower cladding layer 5b. In addition, the ferromagnetic source and drain 22 and 23 may be formed to extend down to a portion below the second lower cladding layer 5b. As described later, the perpendicular magnetized ferromagnetic source and drain 22 and 23 may be easily grown or deposited to semiconductor substrate 10 in the buried manners shown in FIGS. 3A and 3B by using a perpendicularly-laminated multilayered thin film structure, magnetocrystalline anisotropy, or shape anisotropy.

Now, a method of manufacturing the spin transistor according to the embodiment of the present invention will be described with reference to FIGS. 4A to 4E.

Firstly, referring to FIG. 4A, the semiconductor substrate 10 having a multi-layered thin film structure shown in FIG. 2 are formed. Next, both side portions of the semiconductor substrate 10 are removed by using a lithography process and an ion-milling process, so that a ridge structure is formed on the semiconductor substrate 10. The channel layer of two-dimensional electron gas is defined by the ridge structure. A width of the channel layer 107 has a value in a range of 100 nm to 800 nm according to uses.

Next, as shown in FIG. 4B, as a planarization process, insulating layers 8 are formed on the two side portions (the removed portions) of the ridge structure of the resulting product of FIG. 4A. The insulating layer 108 may be formed by using an oxide such as $TaO_x$ and $SiO_2$. The insulating layer 8 has a function of insulating components from adjacent channels.

Next, as shown in FIG. 4C, the source and drain 22 and 23 are formed by depositing a ferromagnetic material on the channel layer 7 by using an electron-beam lithography process and a sputtering process.

The source 22 or the drain 23 may be formed by using a ferromagnetic metallic material selected from a group consisting of Fe, Co, Ni, CoFe, NiFe, and a combination thereof. Alternatively, the source 13 or the drain 14 may be formed by using a magnetic semiconductor material such as (Ga, Mn)As and (In, Mn)As.

As described above, the source and drain 22 and 23 are formed to be magnetized in the direction perpendicular to the surface of the channel layer 7. The perpendicular magnetization of the ferromagnetic source and drain 22 and 23 can be obtained by using, for example, shape anisotropy, magnetocrystalline anisotropy, or thin-film lamination. In the method using the shape anisotropy, a height of the ferromagnetic source or drain 22 or 23 is formed to larger than width and length thereof. In the method using thin-film lamination, thin films are repeatedly laminated to obtain the perpendicular (lamination-directional) magnetization.

On the other hand, before the ferromagnetic source and drain 22 and 23 are deposited, a portion of the semiconductor substrate 10 where the ferromagnetic material is to be deposited may be selectively removed so that the aforementioned cross-sectional structures shown in FIGS. 3A and 3B where the ferromagnetic material is partially buried in the semiconductor substrate 10 can be obtained. For example, after resist is applied on the resulting product of FIG. 4B, the resist corresponding to the portion of the semiconductor substrate 10 where the ferromagnetic material is to be deposited may be removed by using an electron-beam lithography process. Next, the portions of the semiconductor substrate 10 where the ferromagnetic material is to be deposited is removed down to a predetermined thickness or depth by using an ion-milling process or a dry etching process. As a result, a groove having a predetermined depth is formed on the upper surface of the semiconductor substrate 10. A bottom of the groove corresponds to the lower surfaces of the to-be-deposited ferromagnetic source and drain 22 and 23. According to the depth of the groove, the cross-sectional structure shown in FIG. 3A or 3B can be obtained. For example, if the groove is formed to extend down to the channel layer 7 and filed with the perpendicular magnetized ferromagnetic material, the cross-sectional structure shown in FIG. 3B is obtained. A height of spin barrier can be adjusted by using the ion-milling process or the dry etching process. On the other hand, between the ion-milling process and the ferromagnetic source and drain deposition process, a thin natural oxidation film may be generated at the boundary (between the semiconductor substrate and the ferromagnetic material). It is considered that the oxidation film generates a spin barrier to an extent that the oxidation film supports the spin transfer substantially without significant influence to the contact resistance.

After the perpendicular magnetized ferromagnetic source and drain 22 and 23 are formed, as shown in FIG. 4D, the portions where the ferromagnetic material does not exist are filled with an insulating layer 8', so that a planarized product is obtained. Subsequently, as shown in FIG. 4E, a gate insulating layer 16 constructed with an oxide layer is formed on the resulting product of FIG. 4D, and aluminum (Al) or gold (Au) is deposited thereon, so that the gate 17 is formed. As a result, the spin transistor device is obtained. The gate insulating layer 16 is required for preventing direct current leakage from the gate 17 to the semiconductor (semiconductor substrate 10). In addition, a patterning process may be performed by using photolithography at the time of forming the gate insulating layer 16 or the gate 17.

Figure 5:
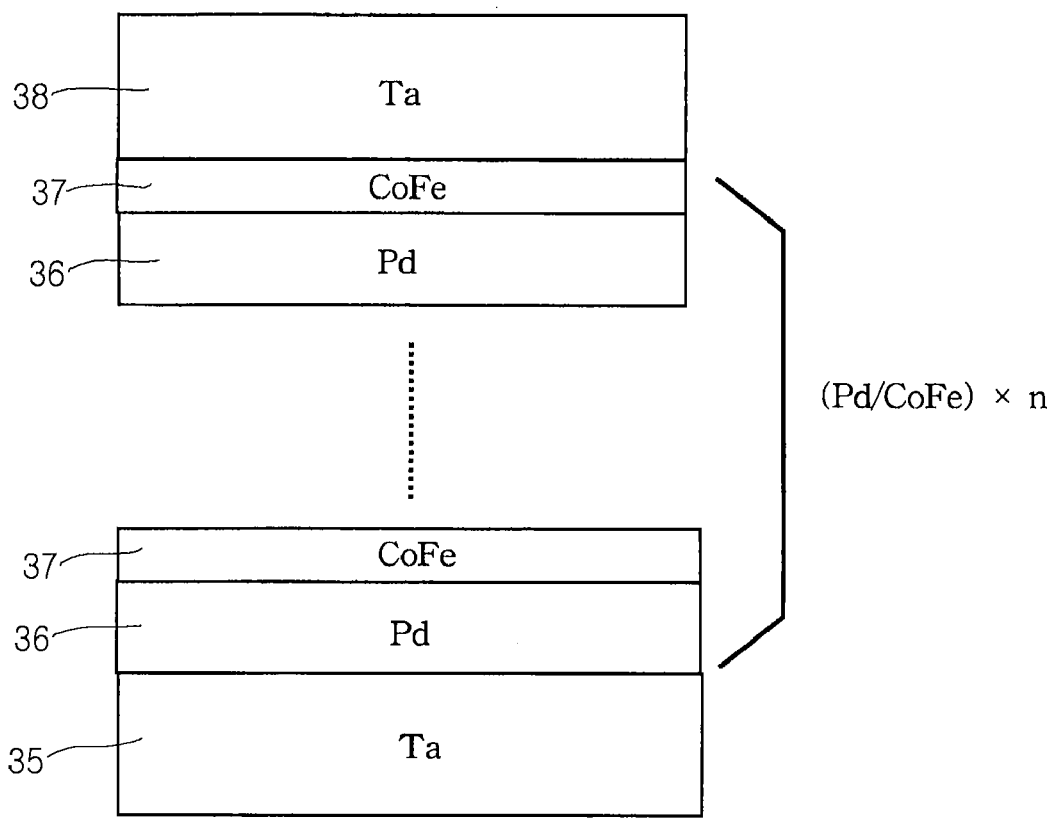
FIG. 5 is a schematic cross-sectional view illustrating a perpendicular magnetized multi-layered thin film which can be used for a source or a drain of a spin transistor according to an embodiment of the present invention.

FIG. 5 is a schematic cross-sectional view illustrating a perpendicular magnetized multi-layered thin film which can be used for a source or a drain of a spin transistor according to an embodiment of the present invention. Referring to FIG. 5, a CoFe layer (ferromagnetic film) and a Pd layer (non-magnetic film) are alternately laminated. As the uppermost and lowermost layers, a Ta layer may be formed. Due to the lamination structure, the perpendicular (lamination-directional) magnetized ferromagnetic member can be formed. The ferromagnetic film may be formed by using Co, Ni, NiFe, or a combination thereof instead of CoFe. In addition, the non-magnetic film may be formed by using Au, Pt, or a combination thereof instead of Pd. The number n of repeated layers is sufficiently 10 or less. In other words, even in a case where the number n is in range of 5 to 10, the perpendicular magnetization can be sufficiently obtained. When the lamination structure is used for the ferromagnetic source and drain 22 and 23, it is possible to easily implement the source and drain 22 and 23 having the magnetization perpendicular to the surface of the channel layer 7.

Figure 6:
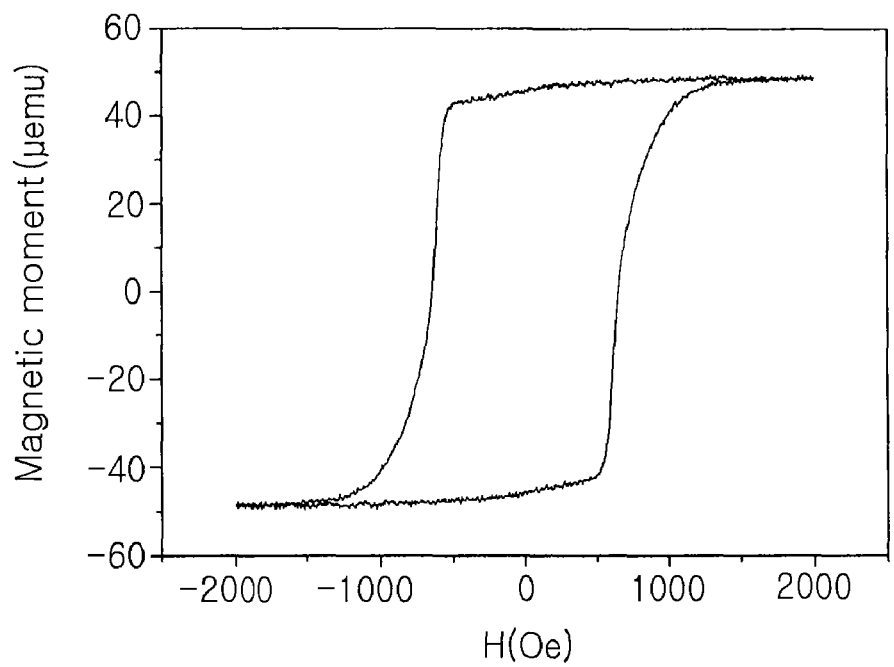
FIG. 6 is a graph illustrating a perpendicular magnetic hysteresis curve of a multi-layered ferromagnetic member having the lamination structure shown in FIG. 5.
Figure 7:
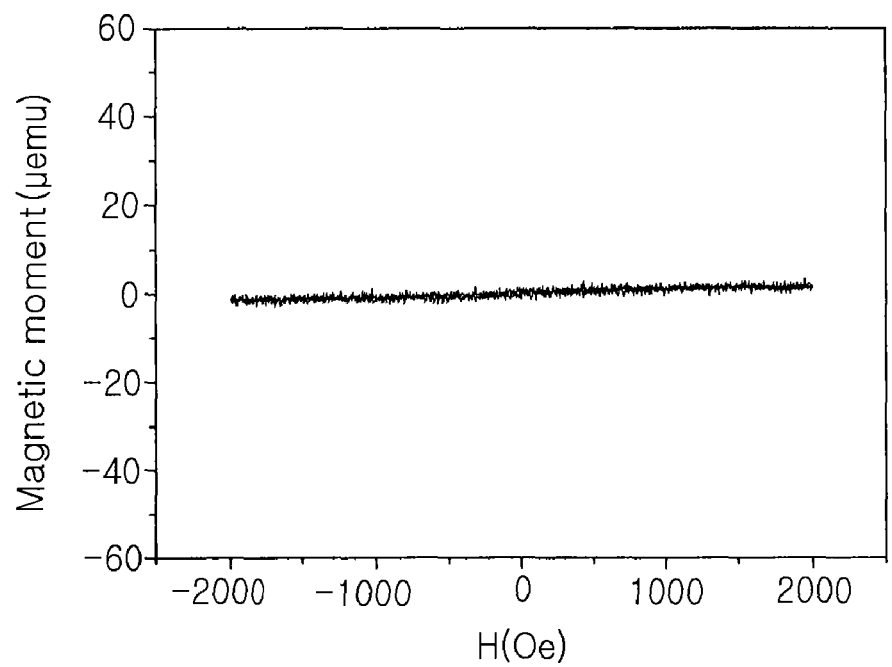
FIG. 7 is a graph illustrating a longitudinal magnetic hysteresis curve of a multi-layered ferromagnetic member having the lamination structure shown in FIG. 5.

FIGS. 6 and 7 are graphs illustrating perpendicular and longitudinal magnetic hysteresis curves of the multi-layered ferromagnetic member having the lamination structure shown in FIG. 5, respectively. More specifically, the graphs of FIGS. 6 and 7 illustrate magnetic moment of the multi-layered thin film structure shown in FIG. 5 measured with an alternating gradient magnetometer under perpendicular and longitudinal magnetic fields. The multi-layered thin film samples used in the magnetic moment measurement is obtained by repeatedly (seven times) depositing a double-layer structure of CoFe(thickness: 0.3 nm)/Pd(thickness: 1.3 nm). Referring to FIGS. 6 and 7, it can bee seen that perpendicular maximum magnetization is larger than longitudinal maximum magnetization. The multi-layered thin film samples used in the magnetic moment measurement have a size of 0.4 mm×0.4 mm and are not patterned, considering the accuracy of the measurement instrument. Particularly, when the magnetic field is reduced down to 0, perpendicular remanent magnetization is larger than longitudinal remanent magnetization. Therefore, it can be understood that the perpendicular magnetization (magnetization perpendicular to the surface of the channel layer 7) can be easily generated and spin electron injection in the perpendicular direction can be effectively performed.

In addition to the aforementioned method of obtaining perpendicular magnetization by alternately laminating the ferromagnetic film and the non-magnetic film, a method of obtaining a perpendicular magnetized ferromagnetic member using shape anisotropy can be used. In this method, the ferromagnetic film is magnetized in a major axis thereof. In this case, a thickness of ferromagnetic film needs to be larger than a width or a length of the ferromagnetic film. As an alternative method of obtaining perpendicular magnetization, there is a method of using magnetocrystalline anisotropy. For example, Co (cobalt) having an hcp (hexagonal close-packed) crystal structure has a characteristic that the magnetization is generated in c-axis direction (that is, the c axis is an easy-magnetization axis). Therefore, by growing the Co in the c-axis crystal direction, the ferromagnetic material of which c-axis is perpendicular to the surface of the channel layer 7 can be obtained. Accordingly, the ferromagnetic source and drain 22 and 23 having the magnetization direction perpendicular to the surface of the channel layer 7 can be implemented by using the ferromagnetic material. The c-axis Co growth can be performed by using a low-speed molecular beam epitaxy (MEB) in high vacuum.

According to the present invention, since magnetization directions of ferromagnetic source and drain are formed to be perpendicular to a surface of a channel layer, it is possible to adjust resistance by using a gate, to easily implement a small-sized spin transistor, and to easily implement a highly-integrated device using the spin transistor. In addition, since the ferromagnetic source and drain 22 are formed to be buried under an upper surface of a semiconductor substrate, it is possible to improve an efficiency of spin electron injection, to reduce noise, and to improve a sensitivity of spin signal.

While the present invention has been shown and described in connection with the exemplary embodiments, it will be apparent to those skilled in the art that modifications and variations can be made without departing from the spirit and scope of the invention as defined by the appended claims.

What is claimed is:

1. A spin transistor comprising:
a semiconductor substrate including a channel layer;
ferromagnetic source and drain disposed on the semiconductor substrate to be separated from each other and to be magnetized in a direction perpendicular to a top surface of the channel layer;
a gate formed on the semiconductor substrate between the source and the drain to adjust spins of electrons passing through the channel layer;
wherein spin-polarized electrons are injected from the source into the channel layer and the electrons injected into the channel layer pass through the channel layer and are injected into the drain;
wherein the spins of the electrons passing though the channel layer undergo precession due to a spin-orbit coupling induced magnetic field according to a voltage of the gate;
wherein the source and drain have magnetocrystalline anisotropy where an easy-crystallization axis is perpendicular to the top surface of the channel layer; and
wherein magnetic directions of the ferromagnetic source and drain are fixed during all device operations in both states of ON and OFF.

2. The spin transistor of claim 1, wherein the ferromagnetic source and drain are magnetized in the same direction.

3. The spin transistor of claim 1, wherein at least one of the source and the drain is made of a magnetic metal selected from a group consisting of Fe, Co, Ni, CoFe, NiFe, and a combination thereof.

4. The spin transistor of claim 1, wherein at least one of the source and the drain is made of a magnetic semiconductor selected from a group consisting of (Ga, Mn)As, (In,Mn)As, and a combination thereof.

5. The spin transistor of claim 1, wherein the channel layer constitutes a two-dimensional electron gas layer.

6. The spin transistor of claim 5, wherein the two-dimensional electron gas layer is formed with a material selected from a group consisting of GaAs, InAs, InGaAs, InSb, and a combination thereof.

7. The spin transistor of claim 1,
wherein the semiconductor substrate includes a lower cladding layer and a upper cladding layer interposing the channel layer constituting a two-dimensional electron gas layer,
wherein the lower cladding layer includes a first lower cladding layer and a second lower cladding layer formed under the first lower cladding layer and having a band gap larger than that of the first lower cladding layer, and
wherein the upper cladding layer includes a first upper cladding layer and a second upper cladding layer formed on the first upper cladding layer and having a band gap larger than that of the first upper cladding layer.

8. The spin transistor of claim 7, wherein the source and the drain are buried under the upper surface of the semiconductor substrate to extend down to the first upper cladding layer or a portion below the first upper cladding layer.

9. The spin transistor of claim 8, wherein lower surfaces of the source and the drain are formed to extend down to the channel layer.

10. The spin transistor of claim 8, wherein lower surfaces of the source and the drain are formed to extend down to the lower cladding layer.

11. The spin transistor of claim 7,
wherein the channel layer is made of InAs,
wherein the first lower cladding layer and first upper cladding layer are made of undoped InGaAs, and
wherein the second lower cladding layer and the second upper cladding layer are made of undoped InAlAs.

12. The spin transistor of claim 1,
wherein the semiconductor substrate has a ridge structure where two side portions of the semiconductor substrate are removed in the length direction of the channel layer,
wherein a width of the channel layer is defined according to the ridge structure, and
wherein a insulating layer for planarization is formed on the two side portions of the ridge structure.

13. A spin transistor comprising:
a semiconductor substrate including a channel layer;
a ferromagnetic source and drain disposed on the semiconductor substrate to be separated from each other and to be magnetized in a direction perpendicular to a top surface of the channel layer;
a gate formed on the semiconductor substrate between the ferromagnetic source and drain to adjust the spins of electrons passing through the channel layer;
wherein spin-polarized electrons are injected from the source into the channel layer, and the electrons injected into the channel layer pass through the channel layer and are injected into the drain;
wherein the spins of the electrons passing through the channel layer undergo precession due to a spin-orbit coupling induced magnetic field according to a voltage of the gate;
wherein a height of each of the source and the drain is larger than a width and a length thereof to form shape anisotropy, so that magnetization direction thereof is perpendicular to the top surface of the channel layer; and
wherein magnetic directions of the ferromagnetic source and drain are fixed during all device operations in both states of ON and OFF.

* * * * *

UNITED STATES PATENT AND TRADEMARK OFFICE
CERTIFICATE OF CORRECTION

PATENT NO. : 7,994,555 B2
APPLICATION NO. : 11/949659
DATED : August 9, 2011
INVENTOR(S) : Hyun-Cheol Koo et al.

It is certified that error appears in the above-identified patent and that said Letters Patent is hereby corrected as shown below:

Column 1, line 15 – Replace "relate to" with --relates to--

Column 3, line 64 – Replace "$H_{Rashba}\ \square k \times E$" with --$H_{Rashba}\ \propto k \times E$--

Column 4, line 55 – Replace "injection, an" with --injection, a--

Column 4, line 62 – Replace "includes an" with --includes a--

Column 5, line 65 – Replace "anion-milling" with --an ion-milling--

Column 7, line 37 – Replace "after resist" with --after resistance--

Column 7, line 38 – Replace "the resist" with --the resistance--

Column 8, line 42 – Replace "can bee seen" with --can be seen--

Signed and Sealed this
Thirty-first Day of July, 2012

David J. Kappos
*Director of the United States Patent and Trademark Office*